United States Patent
Wu et al.

(10) Patent No.: US 9,941,008 B1
(45) Date of Patent: Apr. 10, 2018

(54) TERNARY CONTENT ADDRESSABLE MEMORY DEVICE FOR SOFTWARE DEFINED NETWORKING AND METHOD THEREOF

(71) Applicant: NATIONAL TAIWAN UNIVERSITY, Taipei (TW)

(72) Inventors: An-Yeu Wu, Taipei (TW); Ting-Sheng Chen, Taipei (TW); Ding-Yuan Lee, Taipei (TW); Tsung-Te Liu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/466,878

(22) Filed: Mar. 23, 2017

(51) Int. Cl.
*G11C 15/04* (2006.01)

(52) U.S. Cl.
CPC .................. *G11C 15/04* (2013.01)

(58) Field of Classification Search
CPC .............................. G11C 15/046; G11C 15/04
USPC ........................................................ 365/49.17
See application file for complete search history.

(56) References Cited

U.S. PATENT DOCUMENTS

| | | | | |
|---|---|---|---|---|
| 8,582,338 B1* | 11/2013 | Argyres | ................ | G11C 15/04 365/49.1 |
| 8,891,273 B2* | 11/2014 | Vattikonda | ............ | G11C 15/04 365/49.1 |
| 8,934,278 B2* | 1/2015 | Vattikonda | ............ | G11C 15/04 365/189.07 |
| 8,958,226 B2* | 2/2015 | Terzioglu | ............... | G11C 15/00 365/120 |
| 9,484,096 B1* | 11/2016 | Chen | .................... | G11C 15/043 |

* cited by examiner

*Primary Examiner* — Tri Hoang
(74) *Attorney, Agent, or Firm* — Chih Feng Yeh; Huntington IP Consulting Co., Ltd.

(57) ABSTRACT

The present disclosure illustrates a ternary content addressable memory (TCAM) device for software defined networking and method thereof. In the TCAM device, M bits of each forwarding rule is stored as a first part into a NAND-Type TCAM, and N bits of the same forwarding rule is stored as a second part into a NOR-Type TCAM. M bits of searching data is compared with the first part to generate a first matching result, N bits of the searching data is compared with the second part to generate a second matching result when the first matching result indicates match, and comparing process for the second part is disabled when the first matching result indicates mismatch. The mechanism is help to improve flexibility of the TCAM in words length and to reduce power consumption.

10 Claims, 8 Drawing Sheets

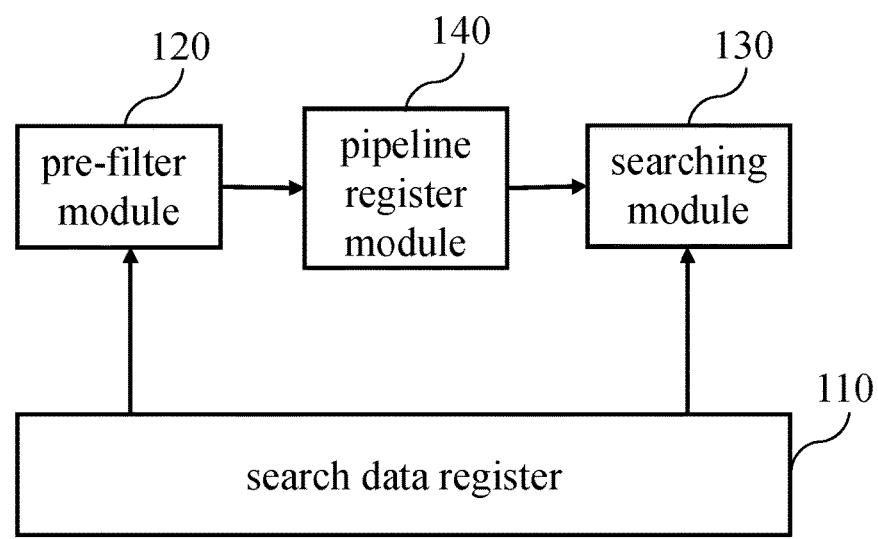
【 Fig. 1 】

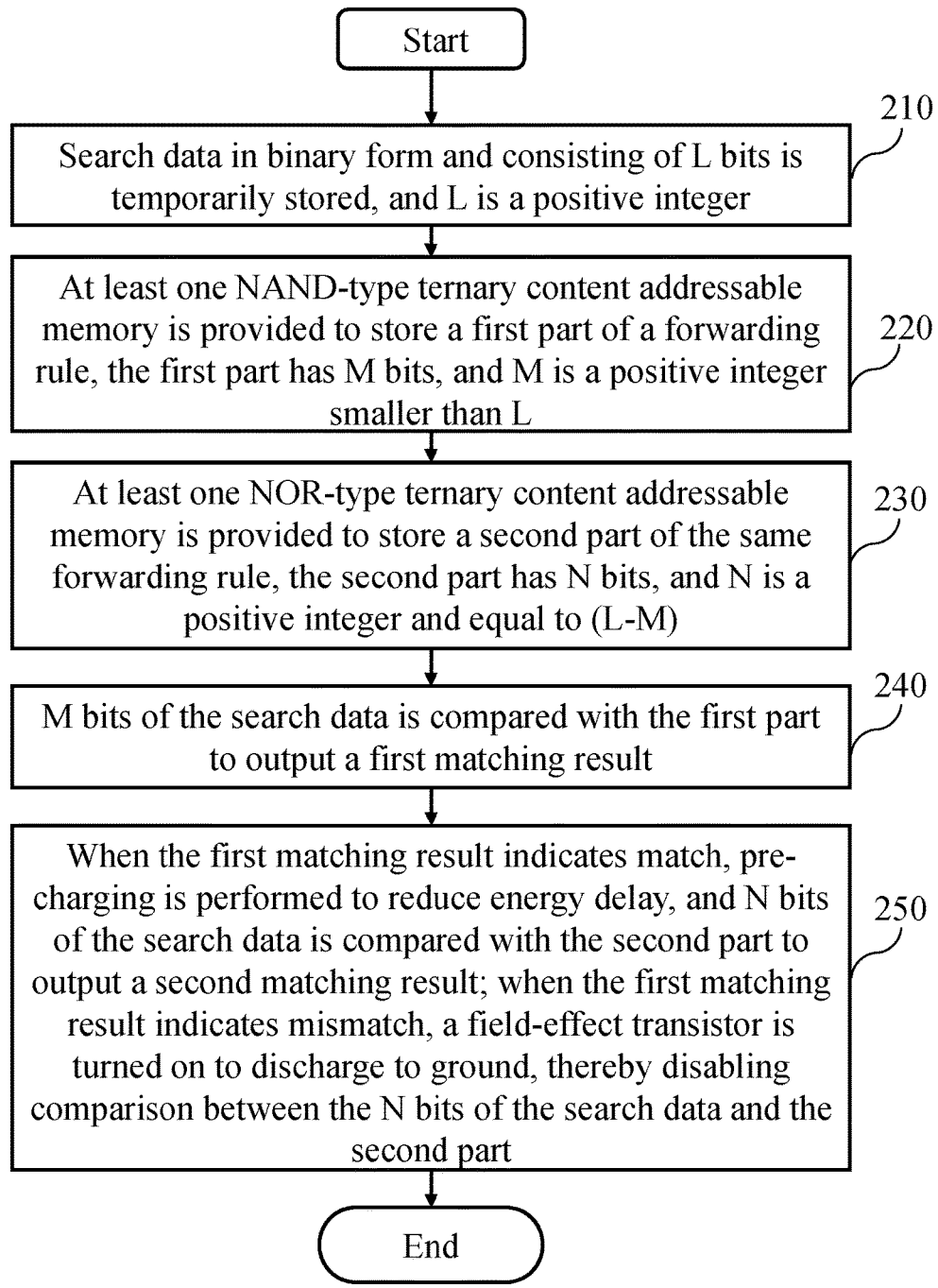
【 Fig. 2 】

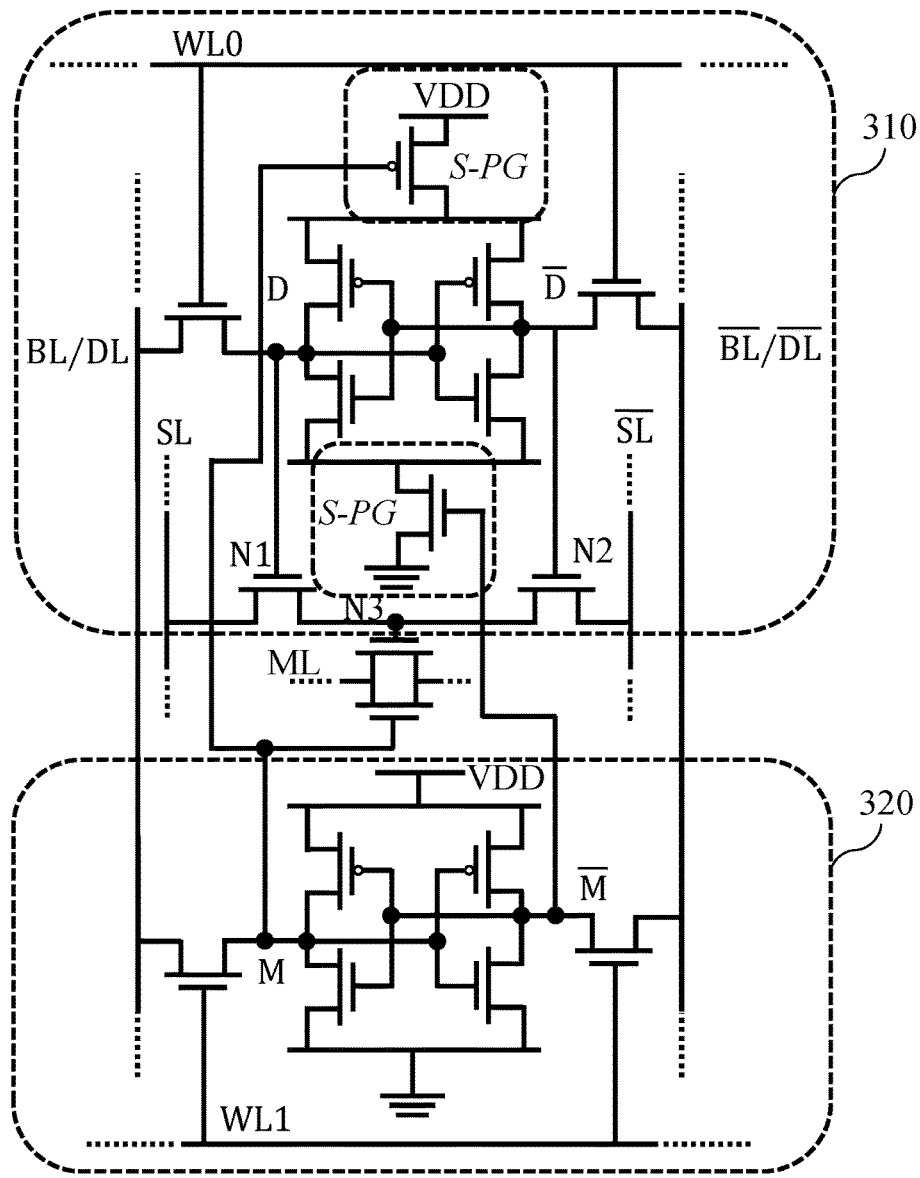
【 Fig. 3 】

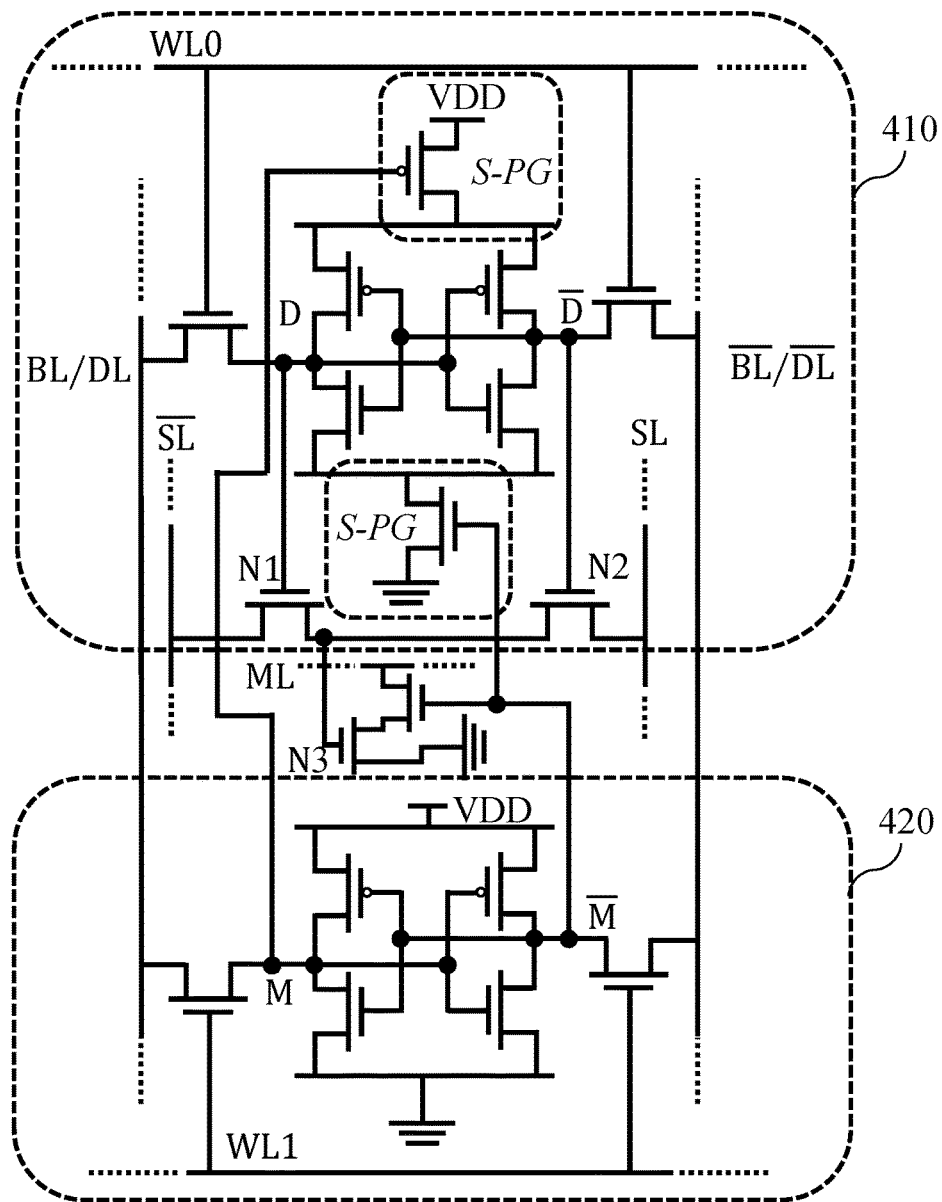
【 Fig. 4 】

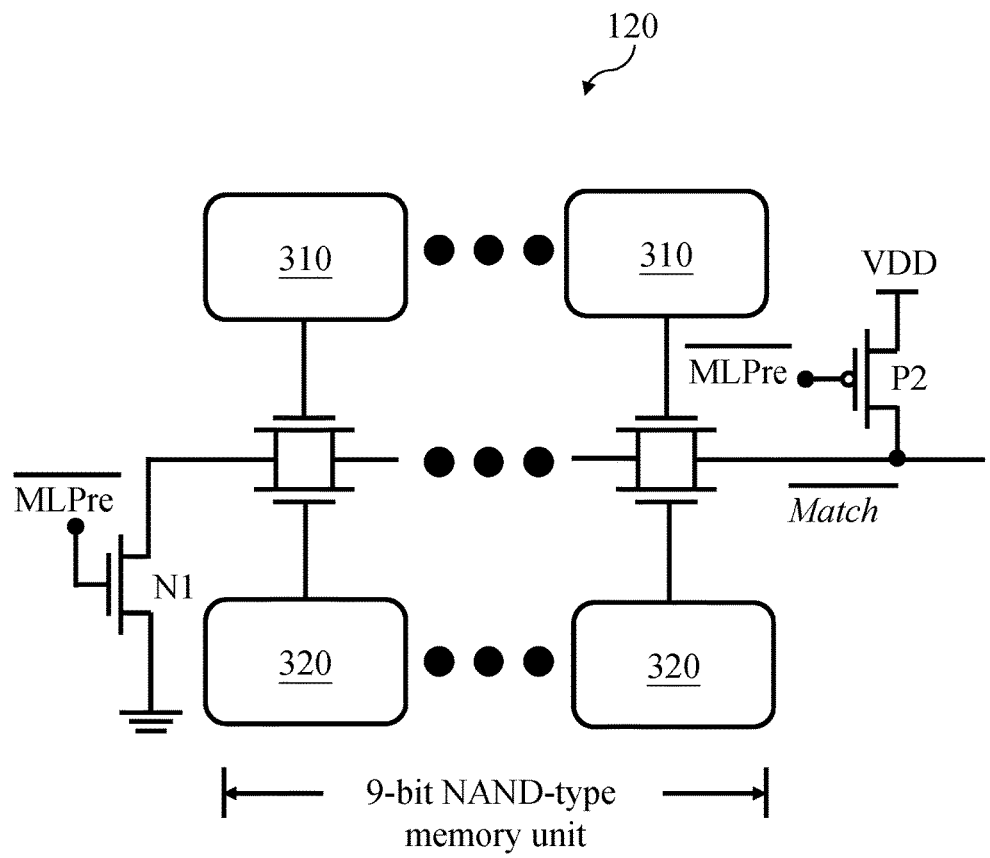
【 Fig. 5 】

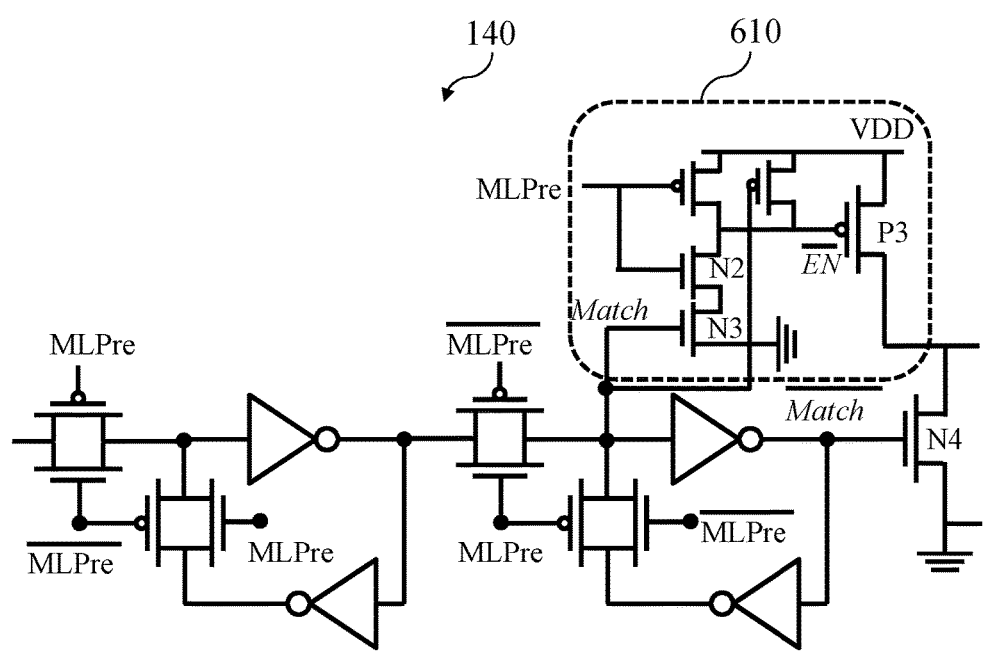
【 Fig. 6 】

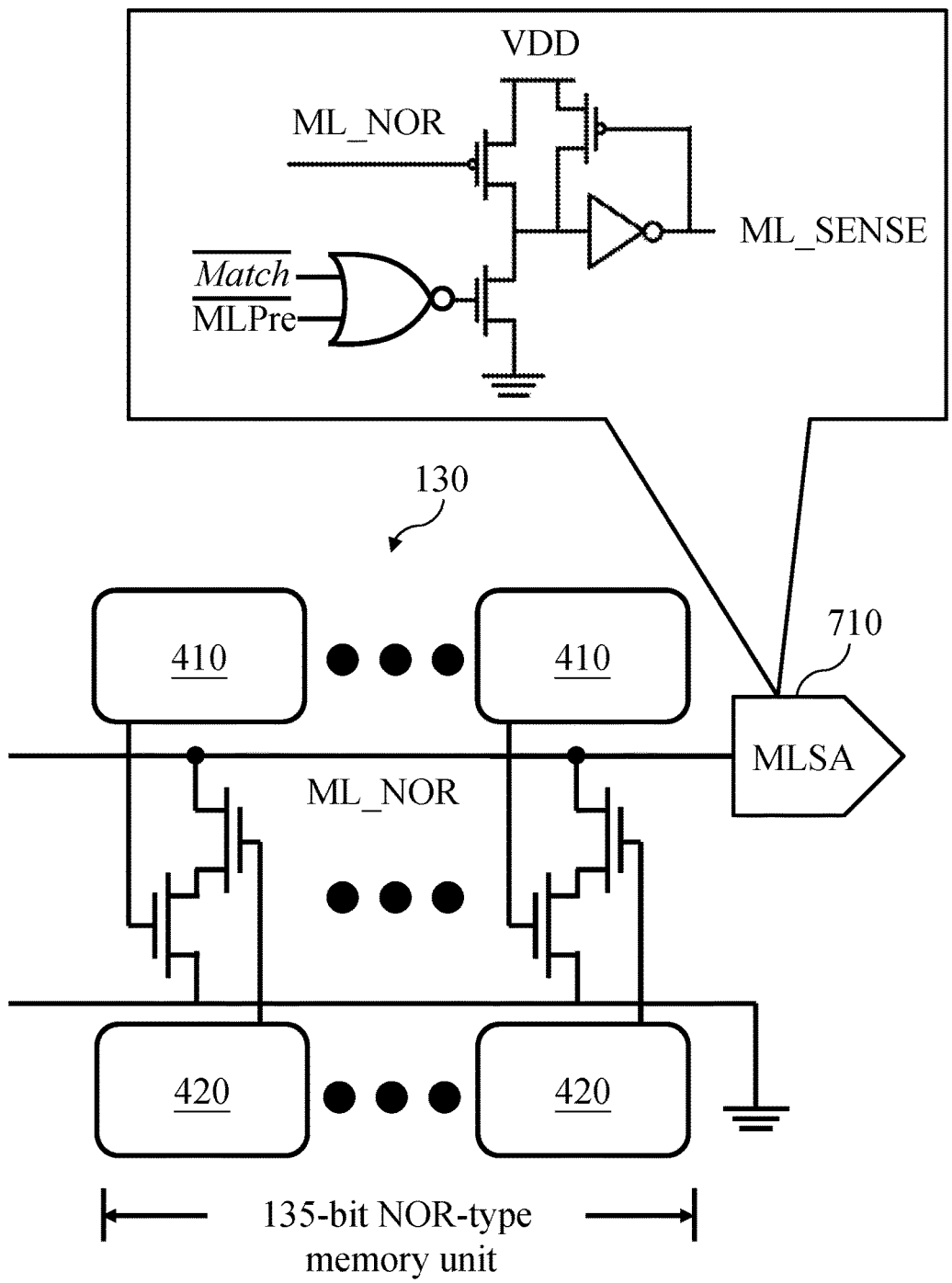
【 Fig. 7 】

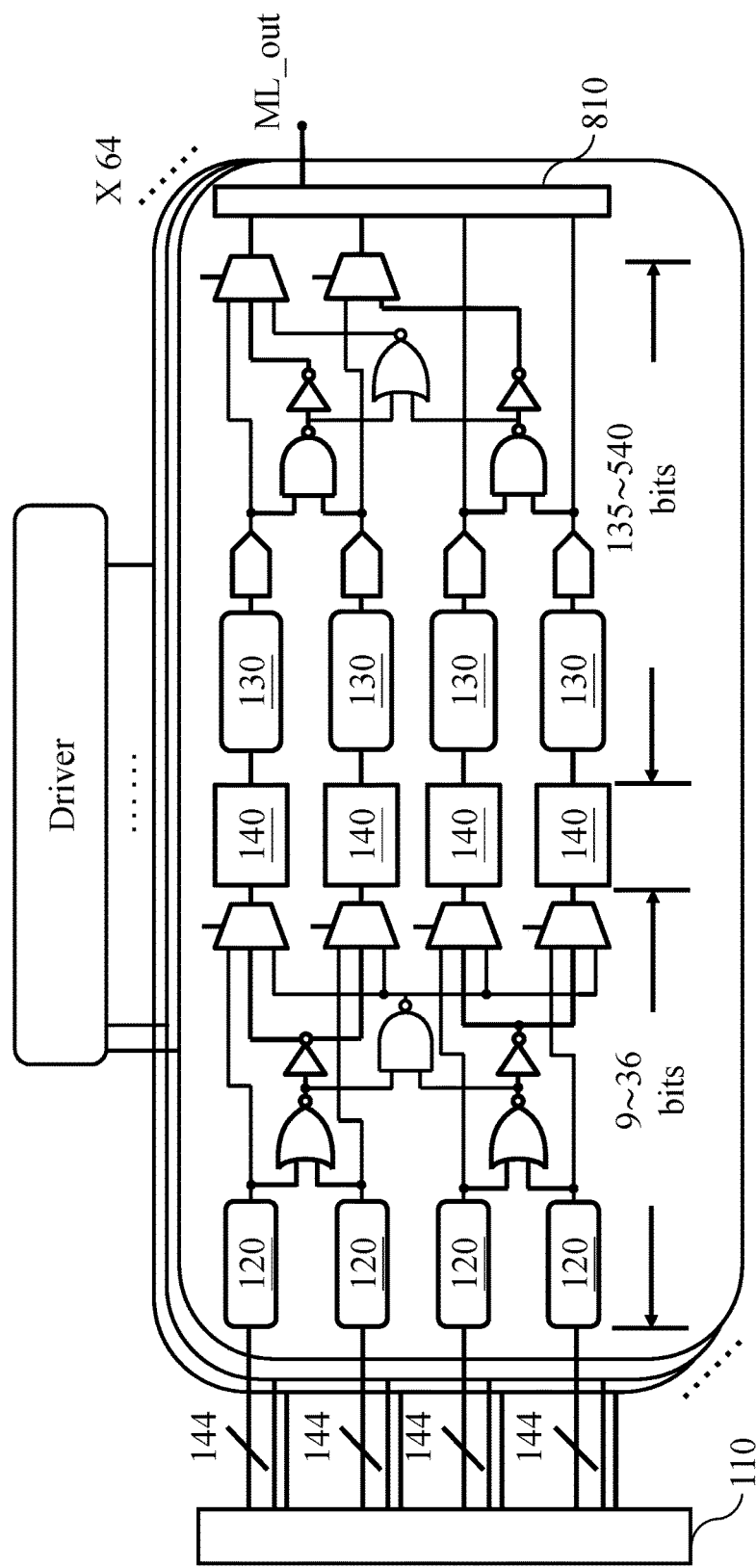
[ Fig. 8 ]

TERNARY CONTENT ADDRESSABLE MEMORY DEVICE FOR SOFTWARE DEFINED NETWORKING AND METHOD THEREOF

BACKGROUND

1. Technical Field

The present disclosure relates to a ternary content addressable memory device and a method thereof, more particularly to a ternary content addressable memory device for software defined networking, which separates a forwarding rule into two parts and uses different types of ternary content addressable memories for filtering and searching, and a method thereof.

2. Description of Related Arts

In recent years, network is rapidly developed and popularized, and network traffic and amount of information are also growing fast. For this reason, many companies pay attention on how to effectively manage the ever-increasing network. Among network management technologies, software defined networking technology attracts the most attention.

Simply put, in conventional network, local routers or local switches manage their packet forwarding rules respectively, but in the software defined networking technology, the packet forwarding rules are in centralized management, and the network can be changed and re-planed by using program in a centralized management manner without changing hardware devices, in order to quickly search the best path for forwarding packet. In the actual implementation, the software defined networking is based on OpenFlow protocol which has characteristics of allowing a longer, variable words length, don't care bit and dispersion. However, it is hard to adapt these characteristics to conventional ternary content addressable memory with fixed words length.

In addition, the ternary content addressable memory consumes a lot of power, and the reason is that match lines of the ternary content addressable memory are charged in preparation for each search, and the match lines which are mismatched are then discharged, and most of the match lines discharge because the mismatched match lines are much more than the matched match lines, and it causes great power consumption. As a result, the conventional ternary content addressable memory has problems of poor flexibility in words length and large power consumption.

There are companies developing technical means to reduce power consumption of the match line, in order to reduce power consumption of the ternary content addressable memory. However, the ternary content addressable memory applying this technical means is still unable to change the words length of the search data, that is, the words length is short and invariable, and the problem of poor flexibility in words length still exists.

Therefore, what is need is to develop a ternary content addressable memory device to solve the problems of high power consumption and poor flexibility in words length.

SUMMARY

In order to solve above-mentioned problem, the present disclosure is to provide a ternary content addressable memory device for software defined networking, and a method thereof.

According to embodiment, the ternary content addressable memory device includes a search data register, a pre-filter module, a searching module, and a pipeline register module. The search data register is configured to temporarily store search data in binary form, and the search data consists of L bits, and L is a positive integer. The pre-filter module is electrically coupled to the search data register, and includes at least one NAND-type ternary content addressable memory to store a first part of a forwarding rule, the first part has M bits and M being a positive integer smaller than L, and the pre-filter module compares M bits of the search data with the first part to output a first matching result. The searching module is electrically coupled to the search data register and includes at least one NOR-type ternary content addressable memory to store a second part of the forwarding rule, the second part has N bits and N is a positive integer and equal to L minus M. After the first matching result indicates match, the searching module compares N bits of the search data with the second part to output a second matching result. The pipeline register module is electrically coupled between the pre-filter module and the searching module, and configured to pre-charge for reducing energy delay, and electrically coupled to the searching module through a field-effect transistor. When the first matching result indicates mismatch, the field-effect transistor is turned on to discharge to ground, thereby disabling the searching module.

According to embodiment, a ternary content addressable memory method for software defined networking includes following steps: temporarily storing search data in binary form, wherein the search data consists of L bits and L is a positive integer; providing at least one NAND-type ternary content addressable memory to store a first part of a forwarding rule, wherein the first part has M bits and M is a positive integer smaller than L (M<L); providing at least one NOR-type ternary content addressable memory to store a second part of the forwarding rule, wherein the second part has N bits, N is a positive integer and equal to L minus M; comparing M bits of the search data with the first part to output a first matching result; and under a condition that the first matching result indicates match, performing pre-charge to reduce energy delay, and comparing N bits of the search data with the second part to output a second matching result, and under a condition that the first matching result indicates mismatch, turning on a field-effect transistor to discharge to ground, thereby disabling comparison between the N bits of the search data and the second part.

To summarize, the difference between the present disclosure and conventional technology is that the memory device of the present disclosure uses the NAND-type ternary content addressable memory to store the M bits of the forwarding rule as the first part, and uses the NOR-type ternary content addressable memory to store the N bits of the same forwarding rule as the second part, and compares the M bits of the search data with the first part to output the first matching result, and when the first matching result indicates match, the memory device of the present disclosure compares the N bits of the search data with the second part to output the second matching result; when the first matching result indicates mismatch, the memory device of the present disclosure disables the comparison between the N bits of the search data and the second part.

Therefore, the technical means of the present disclosure may solve conventional technology problem, to achieve technical effects of improving flexibility of the ternary content addressable memory in words length and reducing power consumption.

BRIEF DESCRIPTION OF THE DRAWINGS

The structure, operating principle and effects of the present disclosure will be described in detail by way of various embodiments which are illustrated in the accompanying drawings.

FIG. 1 is a block diagram of a ternary content addressable memory device for software defined networking, in accordance with the present disclosure.

FIG. 2 is a flowchart showing the steps in an operation of a ternary content addressable memory method for software defined networking, in accordance with the present disclosure.

FIG. 3 is a circuit diagram of a NAND-type ternary content addressable memory of the present disclosure.

FIG. 4 is a circuit diagram of a NOR-type ternary content addressable memory of the present disclosure.

FIG. 5 is a circuit diagram of a pre-filter module of the present disclosure.

FIG. 6 is a circuit diagram of a pipeline register module of the present disclosure.

FIG. 7 is a circuit diagram of a searching module of the present disclosure.

FIG. 8 a circuit diagram of an application for different words lengths, in accordance with the present disclosure.

DETAILED DESCRIPTION

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These descriptive embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

A brief description of the present disclosure is illustrated prior to description of a ternary content addressable memory device for software defined networking, and a method thereof of the present disclosure. An objective of the present disclosure is to improve the ternary content addressable memory. Each memory cell of the ternary content addressable memory of the present disclosure is provided with two transistors in cooperation with a mask cell for disable/enable control, and the ternary content addressable memory of the present disclosure uses a pipeline register module to separate a searching process for the forwarding rule into two stages, and a second-stage search is performed when a searching result of a first-stage search indicates match, and when the searching result of the first-stage search indicates mismatch, the second-stage search is disabled. Finally, the packet is forwarded according to the forwarding rule which is matched in both two stages. By using aforementioned technology, power consumption of the ternary content addressable memory device may be reduced, and each set including a pre-filter module, a pipeline register module and a searching module, or a combination of the multiple sets may be used to implement adjustment of the words length. The detailed illustration will be described below with reference to the accompanying drawings.

The ternary content addressable memory device for software defined networking and the method thereof of the present disclosure will hereinafter be described in more detail with reference to the accompanying drawings. FIG. 1 is a block diagram of the ternary content addressable memory device of the present disclosure. The ternary content addressable memory device includes a search data register 110, a pre-filter module 120, a searching module 130 and a pipeline register module 140. The search data register 110 is configured to temporarily store search data in binary form, the search data consists of L bits, and L is a positive integer. In the actual implementation, L may be in a range of 144 to 576, that is, the search data may have 144 to 576 bits.

The pre-filter module 120 is electrically coupled to the search data register 110, and includes a NAND-type ternary content addressable memory to store a first part of a forwarding rule, the first part has M bits, and M is a positive integer smaller than L. M bits of search data is compared with the first part to output a first matching result. In the actual implementation, M may be in a range of 9 to 36, that is, the first part may have 9 to 36 bits. Furthermore, a number of bits of the NAND-type ternary content addressable memory is the same as that of the first part. For example, when the first part has 9 bits, the number of the bits of the NAND-type ternary content addressable memory is also 9; similarly, when the first part has 18 bits, the number of bits of the NAND-type ternary content addressable memory is also 18, and so on. Each bit of the NAND-type ternary content addressable memory is electrically coupled to a mask cell which is configured to set the corresponding bit as a "don't care bit". The mask cell may be set to logic 1 to disable the comparison for the bit corresponding thereto.

The searching module 130 is electrically coupled to the search data register 110, and includes a NOR-type ternary content addressable memory to store a second part of the forwarding rule, the second part has N bits, and N is a positive integer and equals L minus M (that is, L-M). When the first matching result indicates "match", N bits of search data are compared with the second part of the same forwarding rule to output a second matching result. For example, when L is 144 and M is 9, N is 135 (that is, 144 minus 9 equals 135), and in the actual implementation, N may be in range of 135 to 540, so the second part may have 135 to 540 bits. Furthermore, a number of bits of the NOR-type ternary content addressable memory is the same as that of the second part, for example, when the second part has 135 bits, the number of bits of the NOR-type ternary content addressable memory is also 135. When the second part has 270 bits, the number of the bits of the NOR-type ternary content addressable memory is also 270, and so on. Similarly, each bit of the NOR-type ternary content addressable memory is electrically coupled to a mask cell which is configured to set the corresponding bit as a "don't care bit".

As a result, the mask cell may be set to logic 1 to disable comparison for the bit corresponding thereto.

The pipeline register module 140 is electrically coupled between the pre-filter module 120 and the searching module 130, and configured to charge in preparation to reduce energy delay. The pipeline register module 140 is electrically coupled to the searching module 130 through a field-effect transistor (FET), and when the first matching result indicates "mismatch", the FET is turned on to discharge to ground, so that the searching module 130 is disabled, thereby achieving a purpose of power-saving. In the actual implementation, the pipeline register module 140 may further include a de-glitch circuit to avoid glitch, and the detailed description of the de-glitch circuit will be illustrated below with reference to the accompanying drawings.

Please refer to FIG. 2, which is a flowchart showing the steps in an operation of a ternary content addressable memory method for software defined networking, in accordance with the present disclosure. The ternary content addressable memory method includes following steps. In a step 210, search data, which is in binary form and consists of L bits, is temporarily stored. L is a positive integer. In a step 220, a NAND-type ternary content addressable memory is provided to store a first part of a forwarding rule, the first part has M bits, and M is a positive integer smaller than L. In a step 230, a NOR-type ternary content addressable memory is provided to store a second part of the same forwarding rule, the second part has N bits, and N is a positive integer and equal to L minus M (L-M). In a step 240, M bits of the search data is compared with the first part to output a first matching result. In a step 250, when the first matching result indicates match, pre-charging is performed to reduce energy delay, and N bits of the search data is compared with the second part to output a second matching result; when the first matching result indicates mismatch, a field-effect transistor is turned on to discharge to ground, thereby disabling comparison between the N bits of the search data and the second part. Through aforementioned steps, the NAND-type ternary content addressable memory stores the M bits of each forwarding rule as the first part, and the NOR-type ternary content addressable memory stores the N bits of the same forwarding rule as the second part, and the M bits of the search data is then compared with the first part to output the first matching result, and when the first matching result indicates match, the N bits of search data is compared with the second part to output the second matching result; when the first matching result indicates mismatch, the comparison between the N bits of search data and the second part is disabled.

An embodiment is illustrated below in cooperation with FIGS. 3 through 8. Please refer to FIG. 3, which is a circuit diagram of the NAND-type ternary content addressable memory of the present disclosure. In the actual implementation, the pre-filter module 120 uses the NAND-type ternary content addressable memory which includes an XNOR cell 310 to store data, and when a mask cell 320 sets the XNOR cell 310 as a "don't care bit", the comparison for the XNOR cell 310 is disabled to save power. The XNOR cell 310 includes two transistors (S-PG) controlled by the mask cell 320 without using external lines. When the mask cell 320 is set to logic 1, the transistors (S-PG) are controlled to turn off, thereby reducing leakage current. Otherwise, when the mask cell 320 is set to logic 0, the XNOR cell 310 is operated normally. It is to be noted that the transistor (S-PG) may be an n-channel metal oxide semiconductor field-effect transistor (abbreviated as NMOS) or a p-channel metal oxide semiconductor field-effect transistor (abbreviated as PMOS).

Please refer to FIG. 4, which is a circuit diagram of the NOR-type ternary content addressable memory of the present disclosure. In the actual implementation, the searching module 130 uses the NOR-type ternary content addressable memory which includes an XOR cell 410 to store data, and when a mask cell 420 sets the XNOR cell 410 as a "don't care bit", the comparison for the XNOR cell 410 is disabled to save power. The XOR cell 410 also uses two transistors (S-PG) controlled by the mask cell 420 without using external line. When the mask cell 420 is set to logic 1, the transistors (S-PG) are controlled to turn off the XOR cell 410, thereby reducing leakage current. Otherwise, when the mask cell 420 is set to logic 0, the XOR cell 410 is operated normally. Similarly, the transistor (S-PG) may be an NMOS or a PMOS.

Please refer to FIG. 5, which is a circuit diagram of the pre-filter module of the present disclosure. The pre-filter module 120 uses the NAND-type ternary content addressable memory which includes the XNOR cell 310 to store data. When a signal MLPre is set to logic 1, a signal $\overline{Match}$ is charged to a high logic level through the PMOS P2, the search data is transmitted to the XNOR cell 310, and the NMOS N1 is turned off to prevent from short-circuiting to ground. When the signal MLPre is logic 0, the PMOS P2 is stopped charging, and when the inputted data is matched with the stored forwarding rule, the match line is discharged to ground. The mask cell 320 may turn on the transistors of the pre-filter module 120 no matter what the matching result of the XNOR cell 310 is.

Please refer to FIG. 6, which is a circuit diagram of the pipeline register module of the present disclosure. Because of using OpenFlow router or switch, the don't care bit may be discontinuous, that is, the "don't care bit" may occur in the pre-filter module 120. For this reason, the memory device of the present disclosure replaces a NAND-type content addressable memory by the NAND-type ternary content addressable memory (NAND-TCAM), and is able to complete the search process in a time cycle. In order to improve throughput, the pipeline register module 140 is disposed between the pre-filter module 120 and the searching module 130, and the searching process is separated into two stages. When the first matching result outputted in a first stage of the searching process indicates match, the signal $\overline{Match}$ is logic 0, and the first matching result is stored in left side of the pipeline register module 140 first and transmitted to right side later, and the PMOS P3 is turned on for pre-charging is a subsequent time cycle. Otherwise, when the first matching result indicates mismatch, the PMOS P3 is turned off until the first matching result outputted from the pre-filter module 120 later indicates match. PMOS P3 is controlled by a signal $\overline{EN}$, and $\overline{EN}=\overline{MLPre \cdot Match}$. Furthermore, because of body effect, a threshold voltage of NMOS N2 is higher than that of NMOS N3. The pipeline register module 140 has transmission delay, it causes that the first matching result reaches more slowly than the signal MLPre, so that the de-glitch circuit 610 may be used to electrically connect the signal MLPre to NMOS N2, and connect the signal Match to the NMOS N3, thereby preventing unnecessary power consumption caused by glitch. It is to be noted that if NMOS N2 and NMOS N3 are connected in a reverse order, the signal $\overline{EN}$ may cause unnecessary power consumption because the NMOS N2 discharges more slowly than the NMOS N3.

Please refer to FIG. 7, which is a circuit diagram of the searching module of the present disclosure. In the actual implementation, the searching module 130 includes a match-line sense amplifier 710 (MLSA) having clock gating. When match occurs in first stage (that is, the first matching result indicates match), a voltage level of ML_NOR is charged to VDD first, and at the same time, the match-line sense amplifier 710 is turned on and a voltage level of ML_SENSE is set to logic 1. When the second matching result outputted from the searching module 130 indicates mismatch, the match-line sense amplifier 710 senses the mismatch situationand the voltage level of ML_NOR starts to be discharged, and when the voltage level of ML NOR is discharged to the threshold voltage (|Vtp|), the voltage level of ML_SENSE is pulled down to ground. On the other hand, when the first matching result of the first stage indicates mismatch, the match-line sense amplifier 710 is not turned on, thereby decreasing unnecessary power consumption. In other words, different from the NAND-type ternary content addressable memory in which the voltage level of the match line is pulled down when all bits are matched, the voltage level of the match line of the NOR-type ternary content addressable memory is discharged to ground when any of the bits is mismatched. The mask cell 420 may turn off a pull-down transistor of the searching module 130.

Please refer to FIG. 8, which is a circuit diagram of an embodiment applied to various conditions with different words length, in accordance with the present disclosure. As shown in FIG. 8, four pre-filter modules 120, four searching modules 130 and four pipeline register modules 140 are used in this application. In the actual implementation, these modules may be grouped into four sets, and each set includes a pre-filter module 120, a searching module 130 and a pipeline register module 140 and configured to compare each forwarding rule having 144 bits or less. Furthermore, these modules may be grouped into two sets to compare each forwarding rule having 288 bits (144*2) or less; alternatively, these modules may be combined as one set to compare each forwarding rule having 576 (144*4) bits or less. As a result, the embodiment may be applied to various conditions with different words lengths. More specifically, the present embodiment has three modes. In the mode 1, the four sets respectively compare four individual 144-bit forwarding rules from the search data register 110, and the comparison results are outputted to ML Out through a shift register 810. In the mode 2, the first set and the second set are combined as one set, the third set and the fourth set are combined as other set, and each combined set compares the forwarding rule having 288 bits or less. The pre-filter module 120 compares first 18 (9*2) bits of the forwarding rule, and when the comparison result indicates match, the searching module 130 compares the remaining 270 (135*2) bits of the forwarding rule. In the mode 3, the four sets are combines as one set to compare the forwarding rule having 576 bits or less. The pre-filter module 120 compares the first 36 bits, and when the comparison result indicates match, the searching module 130 compares the remaining 540 bits of the forwarding rule. The combination scheme may be implemented by a plurality of multiplexers and logic gates, as shown in FIG. 8. The multiplexers may set which mode is used. For example, the wires, multiplexers and logic gates which the signals pass through in the mode 2 are shown in bold black lines of FIG. 8. It is to be noted that the four sets may further be combined as an unit which compares the forwarding rule having 576 bits or less, and multiple units (such as 64 units) may expansively form a ternary content addressable memory array (such as a 576*64 array) to process multiple routing tables at the same time. As a result, in the mode 1, this array may compare 256*144 bits, in the mode 2, this array may compare 128*288 bits, and in the mode 3 this array may compare 64*576 bits.

To summarize, the difference between the present disclosure and conventional technology is that the memory device of the present disclosure uses the NAND-type ternary content addressable memory to store the M bits of the forwarding rule as the first part, and uses the NOR-type ternary content addressable memory to store the N bits of the same forwarding rule as the second part, and compares the M bits of the search data with the first part to output the first matching result, and when the first matching result indicates match, the memory device of the present disclosure compares the N bits of the search data with the second part to output the second matching result; when the first matching result indicates mismatch, the memory device of the present disclosure disables the comparison between the N bits of the search data and the second part. As a result, the technical means of the present disclosure may solve conventional technology problem, to achieve technical effects of improving flexibility of the ternary content addressable memory in words length and reducing power consumption.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. A ternary content addressable memory device for software defined networking, comprising:
   a search data register, configured to temporarily store search data in binary form, wherein the search data consists of L bits and L is a positive integer;
   a pre-filter module, electrically coupled to the search data register, and comprising at least one NAND-type ternary content addressable memory to store the first M bits of an L-bit forwarding rule applied to the software defined networking, and M being a positive integer smaller than L, and to compare M bits of the search data with said M bits of the L-bit forwarding rule to output a first matching result;
   a searching module, electrically coupled to the search data register and comprising at least one NOR-type ternary content addressable memory to store the rest N bits of the L-bit forwarding rule, and N being a positive integer and equal to L minus M, wherein when the first matching result indicates match, the searching module compares N bits of the search data with said N bits of the L-bit forwarding rule to output a second matching result; and
   a pipeline register module, electrically coupled between the pre-filter module and the searching module, and configured to pre-charge for reducing energy delay, and electrically coupled to the searching module through a field-effect transistor, wherein when the first matching result indicates mismatch, the field-effect transistor is turned on to discharge to ground, thereby disabling the searching module.

2. The ternary content addressable memory device according to claim 1, wherein the NAND-type ternary content addressable memory has M bits, the NOR-type ternary content addressable memory has N bits, and each of the bits of the NAND-type ternary content addressable memory and the NOR-type ternary content addressable memory is electrically coupled to a mask cell, and each mask cell is configured to set the bit corresponding thereto as a don't care bit.

3. The ternary content addressable memory device according to claim 2, wherein when the mask cell is set to logic 1, comparison for the bit corresponding to the mask cell is disabled.

4. The ternary content addressable memory device according to claim 1, wherein the search data has 144 to 576 bits, the NAND-type ternary content addressable memory has 9 to 36 bits, and the NOR-type ternary content addressable memory has 135 to 540 bits.

5. The ternary content addressable memory device according to claim 1, wherein the pipeline register module comprises a de-glitch circuit to prevent glitch.

6. A ternary content addressable memory method for software defined networking, comprising:
   temporarily storing search data in binary form, wherein the search data consists of L bits and L is a positive integer;
   providing at least one NAND-type ternary content addressable memory to store the first M bits of an L-bit forwarding rule applied to the software defined networking, wherein M is a positive integer smaller than L (M<L);
   providing at least one NOR-type ternary content addressable memory to store the rest N bits of the L-bit forwarding rule, wherein N is a positive integer and equal to L minus M;
   comparing M bits of the search data with said M bits of the L-bit forwarding rule to output a first matching result; and
   under a condition that the first matching result indicates match, performing pre-charge to reduce energy delay, and comparing N bits of the search data with said N bits of the L-bit forwarding rule to output a second matching result, and under a condition that the first matching result indicates mismatch, turning on a field-effect transistor to discharge to ground, thereby disabling comparison between the N bits of the search data and said N bits of the L-bit forwarding rule.

7. The ternary content addressable memory method according to claim 6, wherein the NAND-type ternary content addressable memory has M bits, the NOR-type ternary content addressable memory has N bits, and each of the bits of the NAND-type ternary content addressable memory and the NOR-type ternary content addressable memory is electrically coupled to a mask cell, and each mask cell is configured to set the bit corresponding thereto as a don't care bit.

8. The ternary content addressable memory method according to claim 7, wherein when the mask cell is set to logic 1, comparison for the bit corresponding to the mask cell is disabled.

9. The ternary content addressable memory method according to claim 6, wherein the search data has 144 to 576 bits, the NAND-type ternary content addressable memory has 9 to 36 bits, and the NOR-type ternary content addressable memory has 135 to 540 bits.

10. The ternary content addressable memory method according to claim 6, wherein the step of performing pre-charge to reduce energy delay further comprises:
   using a de-glitch circuit to prevent glitch.

* * * * *